SEMICONDUCTOR SURFACE TREATMENTS AND DEVICES MADE THEREBY

Filed June 20, 1955

INVENTORS
HERBERT NELSON
& ARNOLD MOORE
J. L. Whittaker
ATTORNEY

United States Patent Office 2,897,377

Patented July 28, 1959

2,897,377

SEMICONDUCTOR SURFACE TREATMENTS AND DEVICES MADE THEREBY

Herbert Nelson and Arnold Moore, Princeton, N.J., assignors to Radio Corporation of America, a corporation of Delaware Application June 20, 1955, Serial No. 516,388

10 Claims. (Cl. 307—88.5)

This invention relates to improved surface treatments for semiconductive silicon and germanium and to improved devices utilizing such surface treatments. More particularly, the invention relates to methods of improving the electrical characteristics of semiconductor devices by coating the semiconductive surfaces of such devices with certain selected materials as hereinafter described.

The operation of many semiconductor devices depends upon the existence of minority electric charge carriers within selected regions of the semiconductive bodies of such devices. According to accepted semiconductor theory, electric current in a crystalline semiconductive body may consist of a flow of either majority or minority charge carriers or a combination of both. The majority charge carriers are the ones normally present in relatively large numbers in the material, and, conversely, the minority carriers are the ones normally present in relatively small numbers. The nature of the majority and the minority charge carriers determines the conductivity type of a particular material. For example, if the majority carriers are electrons, the material is n-type. If the majority carriers are holes, the material is p-type.

Minority charge carriers are the signal current transmission means in devices such as transistors. In the operation of a transistor a signal current consisting of minority carriers is injected into a semiconductive body at one electrode. These carriers ordinarily diffuse through the body and some of them are collected at another electrode to produce a signal output current. During their diffusion the minority carriers are apt to combine with majority carriers and become lost, thus subtracting from the signal output current. The combining of the minority carriers with majority carriers is generally known as charge carrier recombination.

Such recombination is particularly active and rapid at the surfaces of semiconductive materials generally. Recombination at the surfaces depletes the local minority carrier concentration adjacent thereto and thereby creates a diffusion gradient which accelerates the minority charge carriers toward the surfaces. This effect is called the surface recombination effect and is measured in terms of the average velocity at which the minority charge carriers approach the surface as they are accelerated thereto by the diffusion gradient.

In germanium devices techniques have been found which are adequate to reduce the surface recombination velocity to commercially acceptable values. In such devices surface recombination velocities of about 100 cm. per second and less may be readily attained. Further improvement, although desirable, is not critically essential at the present time since other factors limit the benefits to be derived therefrom.

In the case of devices utilizing silicon, however, surface recombination is a major problem. Surface recombination velocities in previous silicon semiconductor devices range up to 10,000 cm. per second and greater.

Accordingly, one object of the instant invention is to reduce surface recombination velocities in semiconductive devices utilizing silicon or germanium.

Another object is to provide improved semiconductor devices including bases of semiconductive silicon or germanium.

Still another object is to provide novel semiconductor devices having controllably variable current characteristics.

According to the present invention it has now been discovered that the surface recombination velocities of minority charge carriers in semiconductive silicon and germanium may be substantially reduced by contacting certain inhibitive materials to the silicon and germanium surfaces. The inhibitive materials according to the invention include certain salts of strong acids and electropositive metals and also certain aromatic organic materials.

It has further been found that with certain of the organic inhibitors the reduction in surface recombination may be controllably varied by establishing a variable electric field adjacent to the treated surface. The electric field required for such control is relatively small. It may be provided, for example, by a voltage of less than one volt applied between a semiconductor body and an external electrode positioned about 1 mm. from the surface. As explained in detail hereinafter, such control is utilized in embodiments of the invention including improved variable gain transistors, transducers and other semiconductor devices.

The invention will be explained in greater detail in connection with the accompanying drawing of which:

Similar reference characters are applied to similar elements throughout the drawing.

Figures 1, 2, 3, 4:
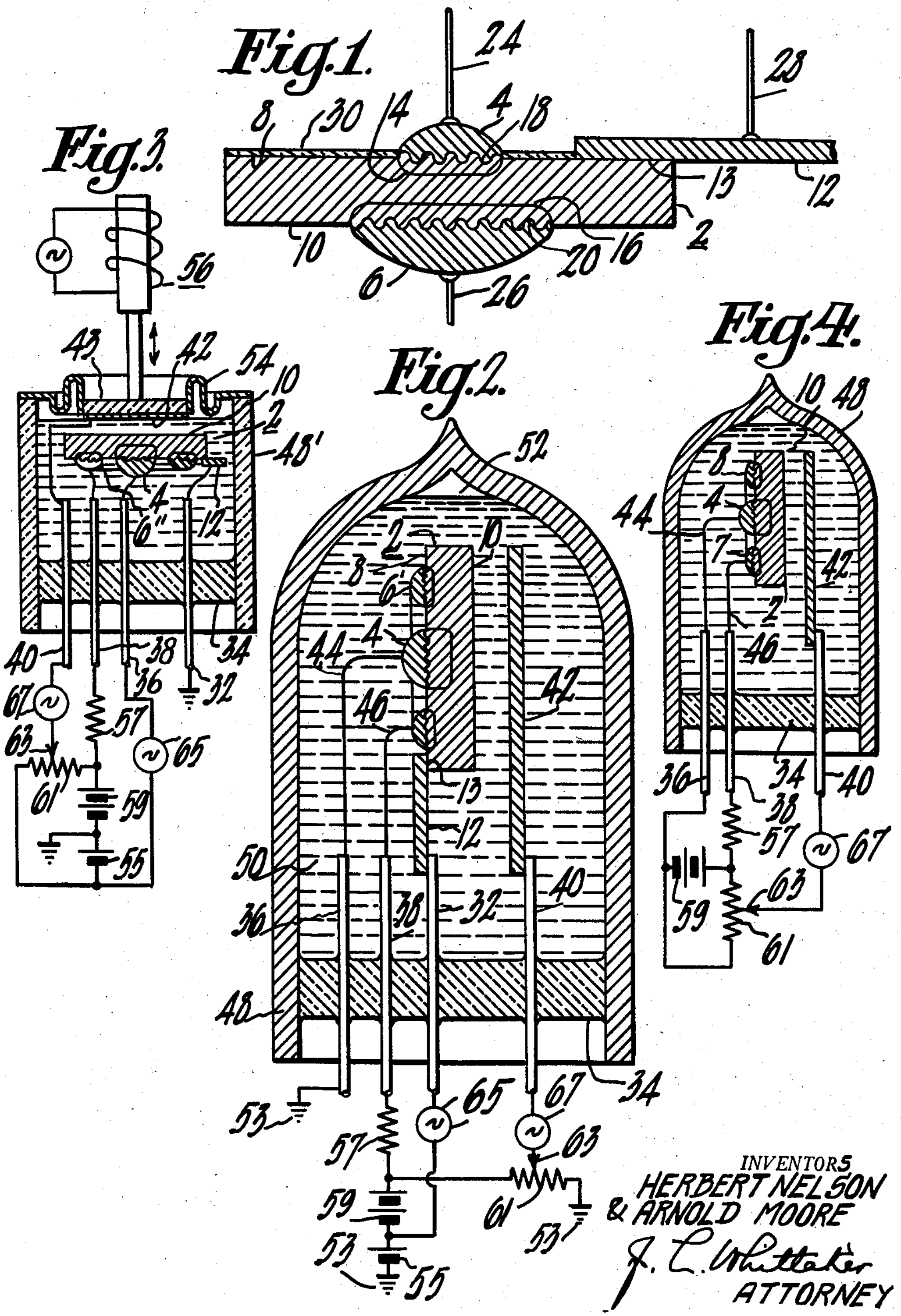
Figure 1 is a schematic, cross-sectional, elevational view of a triode transistor device according to the invention.
Figure 2 is a schematic, cross-sectional, elevational view of a variable gain transistor device according to the invention.
Figure 3 is a schematic, cross-sectional, elevational view of a transducer and signal mixing device according to the invention; and, Figure 4 is a schematic, cross-sectional, elevational view of a variable resistance device according to the invention.

One embodiment of the invention includes the surface treatment of a conventional n-p-n silicon triode transistor as shown in Figure 1. Such a transistor may be made by conventional techniques including surface-alloying a pair of electrodes 4 and 6 upon a semiconductive silicon base wafer 2.

The wafer may be about .125" x .125" x .010" thick when initially cut from a relatively large single crystal ingot of p-type semiconductive silicon. It may have a resistivity of about 1 to 5 ohm-cm. It is initially etched by immersing it in a solution made up of: 25 cc. $HNO_3$ (conc.), 15 cc. HF (48% reagent), 15 cc. $CH_3COOH$ (glacial) and 0.3 cc. $Br_2$, to reduce its thickness to about .005" and to expose a clean, crystallographically undisturbed surface.

The wafer is placed in a graphite jig, or support and two electrode pellets 4 and 6 are placed in coaxial alignment upon opposite surfaces 8 and 10, respectively, of the wafer and held thereon by the jig. The pellets may be spherical in shape and, preferably, one is larger than the other. They may be, for example, about .015" and .030" in diameter respectively. They may consist of any known electrode material capable of forming a p-n rectifying junction when surface alloyed to p-type semiconductive silicon. One suitable material is an alloy of 25% antimony and 75% gold, by weight. A solder coated base tab 12 is also placed upon the wafer, in contact with the surface 8 adjacent to the smaller electrode pellet.

The ensemble is fired in a dry hydrogen atomsphere for about five minutes at about 800° C. to alloy the two pellets into the surfaces of the wafer and simultaneously to form a non-rectifying solder connection 13 between the tab 12 and the wafer.

During firing the pellets dissolve substantial portions of the silicon and thus penetrate into the silicon wafer towards each other. The surfaces 14 and 16 of maximum penetration of the molten pellets are called the alloy fronts. Upon cooling, much of the dissolved silicon in the pellets recrystallizes upon the wafer to form recrystallized regions 18 and 20. The recrystallized regions include significant proportions of antimony, which is a donor type impurity and imparts n-type conductivity to the recrystallized regions. A portion of the antimony may also diffuse into the wafer beyond the alloy fronts and convert small regions of the wafer immediately adjacent to the alloy fronts to n-type conductivity. There are thus formed p-n rectifying junctions (not separately shown) either coincident with or immediately adjacent to the alloy fronts.

After the device is cooled electrical leads 24, 26 and 28 are attached to the alloyed electrodes 4 and 6 and to the tab 12, respectively, and the device is conventionally mounted upon a supporting base (not shown) as desired. It is then again etched to remove any contaminating matter which may have been deposited upon its surfaces during firing or while attaching the leads. Immersion in a hot 5% alkali solution such as KOH or NaOH for 1 to 5 minutes is generally sufficient for this purpose.

According to the instant embodiment of the invention a drop of an aqueous solution of sodium dichromate is then placed upon the surface 8 of the wafer to cover at least the portion of the surface immediately adjacent to the small electrode 4. The concentration limits of the dichromate solution are not critical and may be from a fraction of a gram per liter to saturation. It is preferred to utilize a relatively concentrated solution so that when the solution dries upon the surface, a substantial film of crystalline sodium dichromate is left thereon. The dichromate solution may be applied by brushing, spraying, dropping, immersion or any other convenient means.

After the unit is dried leaving a film of dichromate salt 30 upon the surface the device may be conventionally potted, as by casting it in a resin or sealing it hermetically within a capsule.

A device so made having a dichromate film upon its surface according to the invention may be advantageously utilized as a triode transistor device. The smaller electrode 4 surrounded by the dichromate film 30 is preferably made an emitter electrode when the device is operated in a circuit. The larger electrode 6 is then operated as a collector.

The dichromate film 30 reduces the minority carrier surface recombination velocity upon the surfaces which it contacts. In transistor operation the most critical surfaces with respect to recombination effects comprise the area immediately adjacent to the emitter electrode. Signal carrying minority charge carriers in a transistor are injected by the emitter electrode into the base, which is an electrical term referring to the bulk of the base wafer and often particularly to that portion of the semi-conductor base wafer 2 disposed directly between the emitter and the collector electrodes. The minority charge carriers after they are injected into the base diffuse away from the emitter.

The diffusion process by which the minority carriers are transported through the base is generally similar to gaseous diffusion and is a natural process that tends to create a relatively uniform charge carrier distribution throughout the entire bulk of the wafer. When minority charge carriers approach the collector they are drawn into the collector by an electric field resulting from a bias voltage applied between the collector and the base. The withdrawal of minority charge carriers by the collector lowers the concentration of these carriers in the vicinity of the collector and creates a diffusion gradient in the direction of the collector so that by diffusion the injected minority charge carriers are drawn toward the electrode. Similarly, any localized recombination effect reduces the minority charge carrier concentration in its vicinity and creates a diffusion gradient in its direction.

When the injected charge carriers first enter the base from the emitter they are relatively densely concentrated in the immediate vicinity of the emitter. The surface regions immediately adjacent to the emitter are closer to the concentrated injected charge carriers than is the collector barrier and, if surface recombination is sufficiently intense in these regions a relatively large proportion of the injected carriers will diffuse toward this surface instead of toward the collector.

Those portions of the surface of the base wafer that are relatively remote from the emitter with reference to the collector-emitter spacing are relatively unimportant insofar as their recombination characteristics affect the signal-carrying minority charge carriers. It is highly desirable to minimize the surface recombination effect upon the surface regions of the base wafer immediately adjacent to the emitter electrode. It is not, however, essential that the portions of the base wafer surface relatively remote from the emitter be similarly treated.

One of the important characteristics of a collector electrode is its electrical resistance when it is biased in its reverse direction. If the collector electrode and the base wafer surface immediately adjacent to it are coated with the dichromate film the effective electrical resistance of the collector may be reduced owing to elecrical conductivity provided by the film. This effect will vary, of course, depending upon the thickness of the film and upon the specific material constituting it. It is generally preferred, however, not to coat the base wafer immediately adjacent to the collector electrode. Coating this area to reduce its surface recombination effect provides less advantage than does coating around the emitter. In some instances, especially when the coating is a hydrated salt or is relatively thick, it may provide a relatively large adverse effect upon the collector.

*Properties of the various inhibitors*

The theory of operation involved in the practice of the instant invention is not clearly understood. The inhibitors which have been found to reduce surface recombination velocity upon silicon and germanium surfaces appear to enter into some sort of surface reaction with these materials. It is not known in all cases whether such reaction is chemical, mechanical or electrical in nature.

The strongly oxidizing inorganic salts such as sodium dichromate and potassium permanganate undoubtedly react with the semiconductive materials to produce reaction products of unknown composition. It is these reaction products that are believed to be primarily effective in reducing surface recombination. They are in contact with the surface and may form an intermediate layer, or stratum between the surface and an overlying layer of unreacted salt. Such an overlying layer does not appear to be necessary but is usually formed when relatively large quantities of the salts are used.

Applicant has found that the inhibitors may be divided into three principal classes. The first class comprises salts of strong acids and basic hydroxides of electropositive metals (i.e., metals above hydrogen in the electromotive series). Of this class the following salts have been found to be particularly effective: $Na_2Cr_2O_7 \cdot 2H_2O$, $MgCrO_4 \cdot 7H_2O$, $CaCr_2O_7 \cdot 3H_2O$, $Ca(ClO)_2 \cdot 2H_2O$, $Li_2CrO_4$, and $KMnO_4$. All these salts may be applied by evaporation of a water solution in a similar manner to that heretofore described in connection with the preceding example. They all substantially reduce surface recombination velocity in p-type silicon and also, but to a lesser extent reduce the surface recombination velocity in p-type germanium.

The second class comprises quinone and quinhydrone. These materials are equally effective upon both p-type and n-type semiconductive silicon and germanium, and in this respect resemble aniline. They are like the inorganic salts, however, in that they are not sensitive to an electric field and are useful in devices where an electric field is not present adjacent to the critical surfaces. The surface recombination reduction effect of both quinone and quinhydrone is dependent upon the presence of water. The amount of water is not critical and the materials may be applied either in the form of a moist paste or a water solution of any desired concentration. When these materials are used in water solution it is preferred to make such solutions saturated in order to provide an optimum effect.

The third class includes certain organic aromatic and cyclic compounds all of which are liquids at room temperatures. They may be applied undiluted to a silicon or germanium surface. Their effect lasts only so long as they remain in liquid form upon the surface. When they evaporate or are rinsed away the surface recombination velocity of the surfaces reverts to its initial relatively high value.

These organic inhibitors may be subdivided into two sub-groups, the first of which comprises aniline, pyridine, and 2,4-dinitrofluorobenzene. The second sub-group comprises nitrobenzene, o-nitrotoluene and nitrocyclohexane.

The reduction of surface recombination velocity by these liquids requires the presence of an electric field at the surface. The liquids of the first sub-group provide maximum reduction of surface recombination velocity when they are made electrically negative with respect to the silicon surface. Those of the second sub-group provide maximum reduction of surface recombination when they are made electrically positive with respect to the surface. The liquids of both groups, however, reduce the surface recombination velocity of semiconductive germanium or silicon regardless of the polarity of the electrical field applied. All of the materials are particularly effective upon p-type semiconductive silicon. They are also effective upon p-type semiconductive germanium but, as explained heretofore, the effect upon germanium is less pronounced because the initial recombination velocity of untreated germanium surfaces is relatively low as compared to silicon surfaces.

In addition, it has been found that aniline is equally effective upon n-type semiconductive silicon and germanium and its use is not limited to these materials of p-type conductivity.

The strength of thee lectric field required in conjunction with the organic aromatic and cyclic compounds to produce surface recombination velocity reduction is relatively small. While the precise value of the field in the microscopically thin region of contact between the compounds and the surfaces is not known, the effect is readily obtained by the application of a relatively low voltage between the semiconductor surface and an electrode in contact with the surface coating material.

In the operation of many transistor devices, for example, the emitter electrode is commonly biased by a voltage of one volt or less applied between the emitter electrode and the base of the device. A portion of this voltage is taken up, of course, by the base itself so that substantially less than one volt may actually appear across the emitter barrier. This relatively small voltage, however, is sufficient to provide an electrical field at the semiconductor surface immediately adjacent to the emitter large enough to activate an organic inhibitor.

Thus, when one of the organic inhibitors of the invention is applied to the surface of a transistor immediately adjacent to and in contact with its emitter electrode, the required activating electric field is automatically provided by the biasing voltage utilized to operate the emitter electrode.

The requirement for an activating voltage or potential gradient at the semiconductor surface necessitates the provision of an additional external electrode only in certain devices such as photocells where a biased electrode is not incorporated as part of the device close to the area of surface recombination importance.

*Special effect devices*

The sensitivity of the organic inhibitors to an electric field may be advantageously utilized according to the invention to provide novel semiconductor devices such as those illustrated in Figures 2–4.

(1) One device utilizing this effect is a variable gain triode transistor as shown in Figure 2. This device includes a triode transistor comprising a base wafer 2 of p-type semiconductive silicon having a resistivity of about 2–5 ohm-cm. An emitter electrode 4 is surface alloyed upon one face 8 of the wafer. The wafer may be of any convenient size such as about 0.1″ x .085″ in its largest dimensions. Its thickness is selected with particular regard to the depth of penetration of the surface alloyed emitter electrode. Preferably the rectifying barrier, which is disposed at the surface of maximum penetration of the emitter is located within about .001″ of the surface 10 of the wafer opposite from the emitter. The wafer may be, for example, about .003″ thick and the emitter electrode may penetrate about .002″ deep into the wafer.

An annular collector electrode 6′ is also surface alloyed to the wafer upon the same surface 8 with the emitter 4. The collector is arranged concentrically with the emitter and preferably, but not necessarily is alloyed to a shallower depth in the wafer. A base tab 12 is connected to the wafer by a non-rectifying solder connection 13 and is also welded to a supporting pin 32 to provide support for the device upon a mounting base 34. Electrical lead wires 44 and 46 are attached to the emitter and collector electrodes respectively and also to the pins 36 and 38.

An auxiliary, control electrode 42 is mounted in close proximity to the wafer, preferably less than about 1 mm. from the surface 10 opposite from the emitter and collector electrodes. This electrode is preferably of about the same dimensions as or larger than the base wafer of the triode so that its effect may be projected uniformly over the entire wafer surface facing it. The control electrode is welded or otherwise connected to and supported by a base mount pin 40. The pins 32, 36, 38 and 40 are sealed through an insulating member 34 which serves as the principal support for the device. An envelope 48 which may be of metal is sealed to the insulating member 34 and is filled with an organic inhibitor 50 such as aniline before it is pinched off or otherwise sealed closed.

The envelope is not completely filled but a small air space 52 is left to provide room for thermal expansion of the aniline.

The emitter and collector electrodes together with the base may be operated as an ordinary triode transistor device in any known circuit arrangement. The current gain characteristics of the device may be controllably varied by applying a voltage between the control electrode 42 and any of the other leads of the device. Preferably and most simply, such a voltage is applied between the base lead 12 and the control electrode.

An illustrative circuit arrangement is shown in Figure 2. The transistor triode portion of the device is shown connected in a so-called grounded emitter circuit, the emitter electrode 4 being directly connected to a point 53 of reference potential hereinafter referred to as ground.

The base 2 is connected through a signal input source 65 to the positive terminal of a biasing battery 55, the negative of which is connected to ground. The collector electrode 6′ is connected through an output resistor, or load 57 to the positive terminal of a second biasing battery 59. The negative terminal of the second biasing battery is connected directly to the positive terminal of the first one so that the collector is maintained at a positive potential with respect to the base.

A potentiometer 61 is connected between the positive terminal of the second biasing battery 59 and ground and the control electrode 42 is connected through a second input signal source 67 to the movable contact 63 of the potentiometer. All connections may be made by conventional lead wires.

The specific values of the various components of the circuit are not critical features of the invention. They may be determined according to known principles to provide any desired mode of operation. For example, the first and second biasing batteries may be of about 1 to 3 and 6 to 30 volts, respectively. The output resistor may be about 20,000 to 50,000 ohms, and the potentiometer may be about 0.5 megohm.

The potentiometer is included in the circuit to provide means of adjusting the voltage of the control electrode to an optimum average value regardless of the biasing battery voltages. The potentiometer is also useful to compensate for variations in physical spacing between the control electrodes and the triode transistors in different individual devices.

In one type of operation, two alternating, or fluctuating signals are applied to the device. One signal, from the signal source 67 is applied between the control electrode 42 and ground or, as shown, between the control electrode and the potentiometer 61. An output signal current corresponding to the product of the two applied signals is induced by the triode transistor in the output resistor 57. If a voltage signal is desired it may be taken from the circuit by means of a pair of output terminals (not shown) connected to opposite ends of the output resistor.

The triode part of the device operates in an exactly similar manner to other, previous triode transistors of similar design except for two major differences. First, the current gain of the triode is improved by a reduction of surface recombination upon the semiconductor surface 8 adjacent to the emitter and collector electrodes. This reduction of surface recombination is accomplished by the organic inhibitor in combination with the emitter biasing voltage as heretofore explained. Second, the current gain factor of the triode is modified in accordance with the potential of the control electrode. When the control electrode is at the same potential as the triode base charge carriers injected into the base by the emitter diffuse toward the opposite surface 10 and recombine thereat thus detracting from the signal current available to the collector electrode. When the control electrode potential is increased the charge carrier recombination at the surface 10 is decreased and a relatively larger proportion of the injected carriers diffuse toward the collector electrode.

In devices such as illustrated in Figure 2 the value of the surface recombination velocity may be changed from about 5000 cm. per second to less than 50 cm. per second by changing the applied voltage between the base wafer and the control electrode from 0 to −1 volt, when the spacing between the control electrode and the base wafer is about 1 mm. If volume recombination effects are neglected, this change in value of the surface recombination velocity indicates a transconductance of about 0.1 ampere per volt.

Such devices may find application in many different circuit functions such as, for example, automatic volume control circuits.

(2) The electric field sensitivity of the inhibitors may also be utilized in a transducer such as shown in Figure 3. This device is generally similar in most respects to the device shown in Figure 2. It comprises a base wafer 2 of semiconductive silicon having an emitter electrode 4 surface alloyed into one face thereof and an annular collector electrode 6″ concentrically aligned with the emitter. The wafer is provided with a base tab 12, and the electrodes and the base tab are connected by electrical lead wires to mounting pins 36, 38 and 32 respectively.

The transducer differs from the device of Figure 2, however, in that the control electrode 42 is resiliently mounted by means of a bellows 54 so that it may be controllably moved to vary its spacing from the surface 10 of the wafer. The bellows and the control electrode form a part of the envelope 48′ so that the control electrode is mechanically movable by the application of force from outside the envelope. The control electrode 42 may consist, for example, of a relatively thin conductive film disposed upon an insulating member 43. In this way its potential may be controlled or regulated without regard to the potential of the bellows and the remainder of the envelope.

The control member may be actuated by any desired mechanical means such as sonic vibrations of the air or a phonograph pickup needle. The magnetic vibrator 56 shown in the drawing is intended to be illustrative only and not limiting.

For optimum results the average spacing between the control electrode and the silicon wafer is made preferably less than about 1 mm. and the movement of the control electrode is made to take place about this average, or central position. The control electrode may be biased with a potential of about 1 volt with respect to the base wafer and, as before, the remainder of the device may be operated as an ordinary triode transistor. When the control electrode is moved toward the wafer the triode transistor gain increases and when it is withdrawn from the surface the gain decreases.

The device may be utilized in signal mixing circuits such as frequency converters in which case it is capable of mixing a total of at least three signals, multiplying them together.

One of the three signals may be an electrical signal applied to an input circuit connected between the emitter and the collector electrodes. A second electrical input signal may be applied between the control electrode 42 and the base. The third signal may be a mechanical signal utilizing the transducer effect.

If the potential of the control electrode is maintained constant with respect to the base and if a constant alternating current signal is impressed between the emitter and the collector, the device may be operated as a simple transducer having an alternating current output corresponding to a mechanical signal impressed upon the control electrode.

One illustrative circuit for mixing, or multiplying three signals in this device is shown in Figure 3. In this circuit the triode portion of the device is connected in a so-called "grounded base" or "emitter input" circuit, the base 10 being connected directly to ground. The emitter electrode 4 is connected through the signal source 65 to the negative terminal of a first biasing battery 55, the positive terminal of which is connected to ground. The collector electrode 6″ is connected through an output resistor or load 57 to the positive terminal of a second biasing battery 59, the negative terminal of which is grounded. A potentiometer 61 is connected across the two biasing batteries, one end being connected to the positive terminal of the second biasing battery 59, the other end being connected to the negative terminal of the first biasing battery 55. The control electrode 42 is connected through a second electrical signal source 67 to the movable contact 63 of the potentiometer. A third signal is mechanically impressed upon the control electrode, illustratively by an electromechanical vibrator 56.

The values of the various circuit parameters may be the same as for the corresponding elements of the circuit shown in Figure 2.

In operation signals applied from the three signal sources 65, 67 and 56 respectively are multiplied in the device by each other and their product is amplified. An output current corresponding to the product is induced in the output resistor or load 57. If a voltage output signal is desired it may, of course, be taken from a pair of terminals connected to opposite ends of the output resistor as in the preceding example.

(3) Still another device according to the invention is a variable resistance device as shown in Figure 4. This device comprises a base wafer of n-type semiconductive silicon. The wafer may be of about the same dimension as the base wafers of the devices heretofore described in connection with Figures 1 to 3. An emitter electrode 4 is surface alloyed upon one surface 8 of the wafer in a manner exactly similar to the emitter electrode heretofore described in connection with Figure 2. An annular electrode 7 is also disposed upon the surface 8 of the wafer concentrically aligned with the emitter electrode. This second electrode may form an ohmic or a p+-p type connection to the wafer. The device is supported by electrical leads 44 and 46 attached to the emitter and the annular electrodes respectively. A control electrode 42 is disposed in close proximity to the surface 10 of the wafer opposite from the two surface alloyed electrodes.

The wafer and the control electrode are mounted within an aniline-filled envelope 48 in a similar manner to the device shown in Figure 2. Electrical connections are made to respective elements of the devices through lead pins 36, 38 and 40 which are sealed through the insulating base 34 of the envelope 48.

An electrical signal voltage applied between the wafer and the control electrode of the device may be utilized to vary the electrical resistance of the wafer. The device may be operated in any desired circuit such as the one illustrated. This circuit comprises a battery 59 having its negative terminal directly connected to the emitter electrode 4. The positive terminal of the battery is connected through an output resistor or load 57 to the annular electrode. A potentiometer 61 is connected across the two terminals of the battery. The variable contact 63 of the potentiometer is connected through a signal input source 67 to the control electrode 42. The potentiometer is adjusted to provide an optimum average biasing voltage between the control electrode and the wafer. When the control electrode is spaced about 0.5 to 1.0 mm. from the wafer, the optimum voltage is generally about 0.7 to 1 volt.

The operation of this device does not make use of the rectifying characteristics of the semiconductor. The battery biases the emitter barrier in its forward direction and under normal operating conditions the instantaneous voltage between the emitter and the base is never reversed in polarity. The annular electrode also is operated as a non-rectifying electrode. If it forms a p+-p barrier with the base wafer the battery biases it in its forward direction. If it forms an ohmic connection to the base wafer the effect is substantially the same.

The controlling variable parameter in the device is the resistance of the base wafer in the base region, i.e., in that portion of the base wafer disposed between the emitter and annular electrodes and operative in the series electrical circuit including both of these electrodes.

According to presently accepted theory the variation in base wafer resistance produced by varying the control electrode potential may be explained as follows:

Electric charge carriers injected by the emitter electrode serve to increase the conductivity of the wafer and to reduce its electrical resistance. When there is no voltage applied between the control electrode and the wafer the surface recombination of minority charge carrier at the surface 10 adjacent to the control electrode is relatively high. In this condition a relatively large proportion of the charge carriers injected by the emitter recombine at the surface and are not effective to reduce the resistance of the wafer. When, however, a voltage is applied between the control electrode and the wafer the surface recombination at the surface 10 adjacent to the control electrode is reduced in proportion to the magnitude of the voltage. The number of injected charge carriers effective to reduce the electrical resistance of the wafer is thereby increased. Thus the wafer resistance and, therefore, the current flowing through the wafer and through the output resistor or load 57 are responsive to the magnitude of the instantaneous voltage applied between the control electrode and the wafer. An output current corresponding in form to the input signal is induced in the output resistor or load 57. If a voltage signal output is desired it may, of course, be taken from across the output resistor.

Any of the organic inhibitors heretofore described may be substituted for aniline in any of the three specific devices shown in Figures 2–4. The use of the organic inhibitors is not limited, however, to these specific devices. They may be advantageously utilized wherever it is desired to reduce surface combination in p-type semiconductive germanium and silicon and the critical surfaces can be maintained in contact with the liquid inhibitors.

Aniline is the only one of the several electric field-sensitive inhibitors heretofore described that has been found to be equally effective upon surfaces of both n-type and p-type semiconductive germanium and silicon. By using aniline, therefore, the variety of devices improved by the practice of the invention may be extended to include devices having n-type semiconductive bases such as p-n-p transistors.

It should be pointed out that the organic inhibitors of the invention are all highly insulating and do not have any adverse effect when contacted to exposed barriers biased in the reverse direction. Care is preferably taken to avoid such adverse effects with the inorganic inhibitors as explained heretofore, but the organic inhibitors are of a different nature and do not present any problem in this regard.

The invention is not limited to the specific devices, structural arrangements and circuits described herein. Many other embodiments and variations will become apparent to one skilled in the art upon a consideration of the principles of the invention.

Although the invention has been described in connection with devices including surface alloyed electrodes it is equally applicable to devices including other types of electrodes such as point contact and area contact electrodes, and to so-called grown junction devices. The invention may also be practiced in connection with still other devices that have no rectifying elements such as certain photosensitive devices wherein non-rectifying, or ohmic contacts may serve as the only electrodes.

There have thus been described improved methods of reducing the surface recombination effect upon surfaces of semiconductive germanium and silicon and improved devices utilizing the methods. According to the invention inhibitors consisting of inorganic materials are applied preferably in solution to the semiconductor surfaces, leaving a film upon drying, and inhibitors consisting of organic materials are applied in liquid form. Certain of the organic inhibitors produce a variable effect upon surface recombination which effect is controllable by means of varying an applied electric field.

What is claimed is:

1. An electrical device comprising a wafer of a semiconductive material selected from the group consisting of germanium and silicon, a rectifying electrode in contact with said wafer, an auxiliary electrode spaced from said wafer, and a surface recombination inhibitor disposed between and in contact with said wafer and said auxiliary electrode, said inhibitor consisting essentially of at least one substance selected from the group consisting of aniline, pyridine, 2,4-dinitrofluorobenzene, nitrobenzene, o-nitrotoluene and nitrocyclohexane.

2. An electrical device comprising a wafer of a semiconductive material selected from the group consisting of germanium and silicon, a pair of rectifying electrodes in contact with said wafer, an auxiliary electrode spaced from said wafer, a surface recombination inhibitor disposed between and in contact with said wafer and said auxiliary electrode, said inhibitor consisting essentially of at least one substance selected from the group consisting of aniline, pyridine, 2,4-dinitrofluorobenzene, nitrobenzene, o-nitrotoluene and nitrocyclohexane, electrical circuit means interconnected between said pair of rectifying electrodes, said wafer and said auxiliary electrode to apply bias voltages between said rectifying electrodes and said wafer and between said auxiliary electrode and said wafer, signal input means to apply an electrical signal between one of said rectifying electrodes and said wafer, and signal output means coupled between the other one of said rectifying electrodes and said wafer to develop an electrical output signal.

3. An electrical device comprising a wafer of a semiconductive material selected from the group consisting of germanium and silicon, a pair of rectifying electrodes surface alloyed upon one surface of said wafer, an auxiliary electrode spaced from said wafer, a quantity of aniline disposed between and in contact with said wafer and said auxiliary electrode, electrical circuit means interconnected between said pair of rectifying electrodes, said wafer and said auxiliary electrode to apply bias voltages between said auxiliary electrode and said wafer, signal input means to apply an electrical signal between one of said rectifying electrodes and said wafer, and signal output means coupled between the other one of said rectifying electrodes and said wafer to develop an electrical output signal.

4. An electrical device comprising a wafer of a semiconductive material selected from the group consisting of germanium and silicon, a pair of rectifying electrodes in contact with said wafer, an auxiliary electrode spaced from said wafer, a surface recombination inhibitor disposed between and in contact with said wafer and said auxiliary electrode, said inhibitor consisting essentially of at least one substance selected from the group consisting of aniline, pyridine, 2,4-dinitrofluorobenzene, nitrobenzene, o-nitrotoluene and nitrocyclohexane, electrical circuit means interconnected between said pair of rectifying electrodes, said wafer and said auxiliary electrode to apply bias voltages between said rectifying electrodes and said wafer and between said auxiliary electrode and said wafer, first signal input means to apply an electrical signal between one of said rectifying electrodes and said wafer, second signal input means to apply another electrical signal between said auxiliary electrode and said wafer, and signal output means coupled between the other one of said rectifying electrodes and said wafer to develop an electrical output signal.

5. An electrical device comprising a wafer of a semiconductive material selected from the group consisting of germanium and silicon, a pair of rectifying electrodes in contact with said wafer, an auxiliary electrode spaced from said wafer, a surface recombination inhibitor disposed between and in contact with said wafer and said auxiliary electrode, said inhibitor consisting essentially of at least one substance selected from the group consisting of aniline, pyridine, 2,4-dinitrofluorobenzene, nitrobenzene, o-nitrotoluene and nitrocyclohexane, electrical circuit means interconnected between said pair of rectifying electrodes, said wafer and said auxiliary electrode to apply bias voltages between said rectifying electrodes and said wafer and between said auxiliary electrode and said wafer, signal input means to apply an electrical signal between one of said rectifying electrodes and said wafer, means controllably to vary the spacing between said auxiliary electrode and said wafer, and signal output means coupled between the other one of said rectifying electrodes and said wafer to develop an electrical output signal.

6. An electrical device comprising a wafer of a semiconductive material selected from the group consisting of germanium and silicon, a pair of rectifying electrodes in contact with said wafer, an auxiliary electrode spaced from said wafer, a surface recombination inhibitor disposed between and in contact with said wafer and said auxiliary electrode, said inhibitor consisting essentially of at least one substance selected from the group consisting of aniline, pyridine, 2,4-dinitrofluorobenzene, nitrobenzene, o-nitrotoluene and nitrocyclohexane, electrical circuit means interconnected between said pair of rectifying electrodes, said wafer and said auxiliary electrode to apply bias voltages between said rectifying electrodes and said wafer and between said auxiliary electrode and said wafer, first signal input means to apply an electrical signal between one of said rectifying electrodes and said wafer, second signal input means to apply another electrical signal between said auxiliary electrode and said wafer, means controllably to vary the spacing between said auxiliary electrode and said wafer, and signal output means coupled between the other one of said rectifying electrodes and said wafer to develop an electrical output signal.

7. An electrical device comprising a body of a semiconductive material selected from the class consisting of germanium and silicon, an electrode in rectifying contact with said body, an electrode in substantially ohmic contact with said body and spaced from said rectifying electrode, an auxiliary electrode spaced from said body, and a surface recombination inhibitor disposed between and in contact with said body and said auxiliary electrode, said inhibitor consisting essentially of at least one substance selected from the group consisting of aniline, pyridine, 2,4-dinitrofluorobenzene, nitrobenzene, o-nitrotoluene and nitrocyclohexane.

8. An electrical device comprising a body of a semiconductive material selected from the class consisting of germanium and silicon, an electrode in rectifying contact with said body, an electrode in substantially ohmic contact with said body and spaced from said rectifying electrode, an auxiliary electrode spaced from said body, and a surface recombination inhibitor disposed between and in contact with said body and said auxiliary electrode, said inhibitor consisting essentially of at least one substance selected from the group consisting of aniline, pyridine, 2,4-dinitrofluorobenzene, nitrobenzene, o-nitrotoluene and nitrocyclohexane, electrical circuit means connected between said rectifying and said ohmic electrodes to bias said rectifying electrode in its forward direction, electrical circuit means connected between said body and said auxiliary electrode to apply a bias voltage therebetween, signal input means to apply an electrical signal between said body and said auxiliary electrode, and signal output means coupled between said rectifying and said ohmic electrodes to develop an electrical output signal.

9. An electrical device comprising a body of a semiconductive material selected from the group consisting of germanium and silicon, a first electrode in rectifying contact with said body for injecting minority charge carriers therein, a second electrode in rectifying contact with said body and in cooperative relation to said first electrode for collecting said carriers, an electric field-sensitive surface recombination inhibitor in contact with said body for reducing the recombination rate of said carriers, and means to produce an electric field in said inhibitor adjacent to said body for selectively varying the recombination rate of said carriers.

10. An electrical device comprising a body of semiconductive material selected from the group consisting of germanium and silicon, a first electrode in rectifying contact with said body for injecting minority charge carriers therein, a second electrode in rectifying contact with said body and in cooperative relation to said first electrode for collecting said carriers, an electric field-sensitive surface recombination inhibitor in contact with said body for reducing the recombination rate of said carriers, and an auxiliary electrode in contact with said inhibitor and spaced from said body.

References Cited in the file of this patent

UNITED STATES PATENTS

| | | |
|---|---|---|
| 2,524,034 | Brattain et al. | Oct. 3, 1950 |
| 2,612,567 | Stuetzer | Sept. 30, 1952 |
| 2,722,490 | Haynes et al. | Nov. 1, 1955 |
| 2,745,012 | Felker | May 8, 1956 |
| 2,787,744 | Brock et al. | Apr. 2, 1957 |